(12) United States Patent
Fu et al.

(10) Patent No.: US 10,641,831 B2
(45) Date of Patent: May 5, 2020

(54) BATTERY CURRENT MEASUREMENT

(71) Applicant: SCHNEIDER ELECTRIC IT CORPORATION, West Kingston, RI (US)

(72) Inventors: Chun Chih Fu, New Taipei (TW); Lifan Lin, Luodong Township (TW)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 254 days.

(21) Appl. No.: 15/686,187

(22) Filed: Aug. 25, 2017

(65) Prior Publication Data

US 2019/0064274 A1 Feb. 28, 2019

(51) Int. Cl.
*G01R 31/3828* (2019.01)
*H02J 9/06* (2006.01)
*H02J 7/00* (2006.01)

(52) U.S. Cl.
CPC ........ *G01R 31/3828* (2019.01); *H02J 7/0047* (2013.01); *H02J 9/062* (2013.01); *H02J 2007/0095* (2013.01)

(58) Field of Classification Search
CPC ............ H02J 7/0047; H02J 2007/0095; G01R 31/3828
USPC .......................... 320/134, 136, 156, 158, 163
See application file for complete search history.

(56) References Cited

U.S. PATENT DOCUMENTS

| 2011/0014501 | A1* | 1/2011 | Scheucher ............... B60K 1/04 |
| | | | 429/7 |
| 2012/0025615 | A1 | 2/2012 | Kim et al. |
| 2018/0205262 | A1 | 7/2018 | Akita et al. |

FOREIGN PATENT DOCUMENTS

| EP | 1191661 A2 | 3/2002 |
| WO | 2006/026549 A2 | 3/2006 |
| WO | 2011005944 A2 | 1/2011 |
| WO | 2017047221 A1 | 3/2017 |

OTHER PUBLICATIONS

Extended European Search Report from corresponding European Application No. 18185170.0 dated Dec. 13, 2018.

* cited by examiner

*Primary Examiner* — Edward Tso
*Assistant Examiner* — Aaron Piggush
(74) *Attorney, Agent, or Firm* — Lando & Anastasi, LLP

(57) ABSTRACT

A method of detecting a battery current in an uninterruptible power supply and a system directed to the same is provided and includes providing a battery current to a battery along a charging path using a charger, opening the charging path to stop the battery current to the battery, determining a first total current supplied by the charger, while the charging path is opened, enabling the battery current to be provided to the battery, determining a second total current supplied by the charger, while the battery current is being supplied to the battery, and determining a value representative of the battery current.

20 Claims, 7 Drawing Sheets

BATTERY CURRENT MEASUREMENT

BACKGROUND OF INVENTION

1. Field of Invention

The present invention relates generally to systems and methods for detecting trickle current provided to a battery.

2. Discussion of Related Art

The provision of a small trickle current to batteries in power devices, such as Uninterruptible Power Supplies (UPSs), is known. Furthermore, it is known to use trickle current detectors to measure the trickle current provided to the batteries.

SUMMARY OF INVENTION

At least one aspect of the disclosure is directed to a method of detecting a battery current in an uninterruptible power supply including acts of providing a battery current to a battery along a charging path using a charger, opening the charging path to stop the battery current to the battery, determining a first total current supplied by the charger, while the charging path is opened, enabling the battery current to be provided to the battery, determining a second total current supplied by the charger, while the battery current is being supplied to the battery, and determining a value representative of the battery current.

In at least one embodiment, the method further includes acts of storing a first current value indicative of the first total current supplied by the charger. In one embodiment, determining the battery current includes subtracting the first current value from the second total current. In some embodiments, opening the charging path includes opening a switch disposed in the charging path. According to one embodiment, enabling the battery current to be provided to the battery includes closing the switch.

At least one aspect of the disclosure is directed to an uninterruptible power supply system including an input configured to receive input power having an input voltage, a battery configured to store battery power, an output configured to provide output power derived from at least one of the input power and the battery power, a charging circuit, connected to the battery and power circuitry, the charging circuit configured to provide a total current, a first portion of which is provided to the battery and a second portion of which is provided to the power circuitry, a charger current sensor configured to detect the total current and provide an indication of the total current, a switch connected to the battery and being configured to selectively control provision of current to the battery, and a controller, coupled to the switch and to the charger current sensor, the controller being configured to open the switch to prevent the battery from receiving the first portion of the total current, receive, from the charger current sensor, a first sense signal indicative of the total current, close the switch to enable the battery to receive the first portion of the total current, receive, from the charger current sensor, a second sense signal indicative of the total current, and determine a value representative of the first portion of the total current.

In at least one embodiment, the charging circuit includes the charger current sensor. In some embodiments, the charger current sensor includes a differential amplifier and a resistor. In at least one embodiment, the differential amplifier is configured to detect a current through the resistor. In some embodiments, the current through the resistor is the total current. According to one embodiment, the controller is further configured to store a first current value representative of the first sense signal. In at least one embodiment, the first current value is equivalent to the second portion of the total current. In some embodiments, the second portion of the total current is substantially independent of the first portion of the total current. According to some embodiments, the system includes an activation switch.

In at least one embodiment, the activation switch is a Bipolar Junction Transistor (BJT) having a base connection, a collector connection, and an emitter connection. In at least one embodiment, the switch is a Metal-Oxide-Semiconductor Field-Effect Transistor (MOSFET) having a gate connection, a source connection, and a drain connection. According to some embodiments, a gate voltage at the gate connection of the switch is controlled substantially by a collector current drawn by the collector connection of the activation switch. In at least one embodiment, the collector current is controlled substantially by a base current provided to the base connection of the activation switch. According to some embodiments, the base current is controlled substantially by the controller.

Aspects of the disclosure are directed to an uninterruptible power supply system including a charger, connected to a battery and a logic power supply, the charger configured to provide a total current, a first portion of which is provided to the battery and a second portion of which is provided to the logic power supply, the charger including a charger current sensor configured to detect the total current and provide an indication of the total current, and means for controlling the charger current sensor to detect the first portion of the total current and the second portion of the total current.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
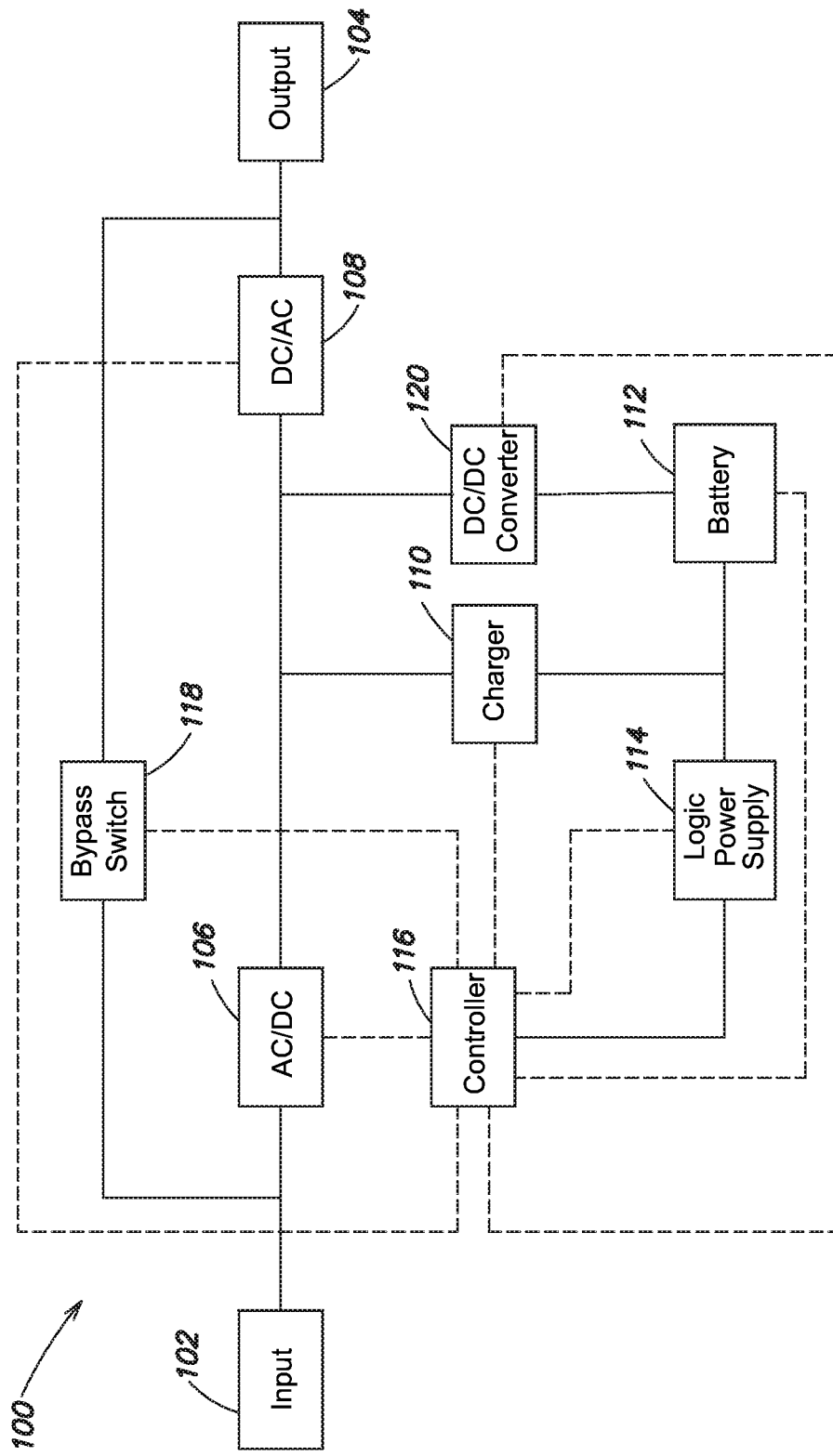
FIG. 1A is a block diagram of an online Uninterruptible Power Supply (UPS)

Aspects and examples are directed to detecting a trickle current provided to batteries in Uninterruptible Power Supplies (UPSs). Existing approaches to measuring trickle current utilize expensive and extraneous components, and consume an unnecessarily high amount of power. Examples provided herein address the foregoing deficiencies to provide trickle current detection at a reduced cost, with fewer components and lower power consumption.

Examples of the methods and systems discussed herein are not limited in application to the details of construction and the arrangement of components set forth in the following description or illustrated in the accompanying drawings.

The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Embodiments discussed herein are generally directed to indirect calculation of a battery trickle current. In some power devices, a battery charger provides a total current that is distributed between the battery and a Logic Power Supply (LPS). As indicated by Equation (1), the charger current is roughly equal to the scalar sum of the battery current and the LPS current:

$$i_T \approx i_{LPS} + i_{Battery} \quad (1)$$

where $i_T$ represents the total current provided by the charger, $i_{LPS}$ represents the current provided to the LPS, and $i_{Battery}$ represents the current provided to the battery. The LPS current $i_{LPS}$ can be calculated by setting the battery current $i_{Battery}$ to zero and measuring the total current $i_T$, which is equivalent to the LPS current $i_{LPS}$ when the battery current $i_{Battery}$ is zero. Setting the battery current $i_{Battery}$ to zero can be accomplished by opening a switch connected in series with the battery, thereby interrupting the conductive path to the battery. Once the LPS current $i_{LPS}$ value—which is substantially constant—is calculated, the battery current $i_{Battery}$ can be calculated at any subsequent time by measuring the total current $i_T$ and subtracting therefrom the known, constant LPS current $i_{LPS}$ value.

Referring now to the drawings, FIG. 1A illustrates a block diagram of an online UPS 100 in accordance with one embodiment. The illustrated UPS 100 includes an input 102, an output 104, an AC/DC rectifier 106, a DC/AC inverter 108, a charger 110, a battery 112, a Logic Power Supply (LPS) 114, a controller 116, a bypass switch 118, and a DC/DC converter 120.

The input 102 is coupled to the output 104 via the bypass switch 118, and is connected to the rectifier 106 and an input power source (not pictured), such as a utility mains power source, configured to provide AC power to the UPS 100. The output 104 is coupled to the input 102 via the bypass switch 118, and is connected to the inverter 108 and a load (not pictured). The rectifier 106 is coupled to the input 102, the inverter 108, and the charger 110, and is communicatively coupled to the controller 116. The inverter 108 is coupled to the rectifier 106, the output 104, and the battery 112, and is communicatively coupled to the controller 116. The charger 110 is coupled to the rectifier 106, the battery 112, and the LPS 114, and is communicatively coupled to the controller 116. The battery 112 is coupled to the charger 110 and the converter 120, and is communicatively coupled to the controller 116. The LPS 114 is coupled to the charger 110 and the controller 116, and is further communicatively coupled to the controller 116. The bypass switch 118 is coupled between the input 102 and the output 104, and is further communicatively coupled to the controller 116. The converter 120 is coupled to the battery 112 and the inverter 108, and is communicatively coupled to the controller 116. The controller 116 is coupled to the LPS 114, and is communicatively coupled to the rectifier 106, the inverter 108, the charger 110, the battery 112, the LPS 114, the bypass switch 118, and the converter 120.

Based on the quality of the AC power received at the input 102, the UPS 100 is configured to operate in one of several different modes of operation. For example, according to one embodiment, the controller 116 monitors the AC power and, based on the characteristics of the monitored AC power, sends control signals to the rectifier 106, the inverter 108, the charger 110, the battery 112, the bypass switch 118, and the converter 120 to control the operating mode of the UPS 100.

The UPS 100 is configured to operate in one of a bypass mode, a battery mode, and a normal operating mode. In the bypass mode, the bypass switch 118 is closed responsive to receiving control signals from the controller 116 such that AC power received at the input 102 is provided directly to the output 104 via the bypass switch 118. In the battery mode, the bypass switch 118 is opened and the battery 112 provides power to the output 104 through the converter 120 and the inverter 108. The converter 120 is configured to convert the DC power received from the battery 112 to a different DC voltage level (e.g., a greater DC voltage level) and provide the converted DC power to the inverter 108. The inverter 108 is configured to convert the received DC power to AC power, and provide the AC power to the output 104.

In the normal operating mode, the bypass switch 118 is opened and the input AC power is provided to the output 104 through the rectifier 106 and the inverter 108, and is provided to the charger 110 through the rectifier 106. The charger 110 is configured to receive the AC power and provide an output current, part of which is provided to the battery 112 to charge the battery 112, and part of which is provided to the LPS 114 to power the LPS 114. The LPS 114, in turn, is configured to provide power to the logic components of the UPS 100 including, for example, the logic components of the controller 116. In some embodiments, the charger 110 may be configured to provide the output current to alternate or additional components.

Figure 1B:
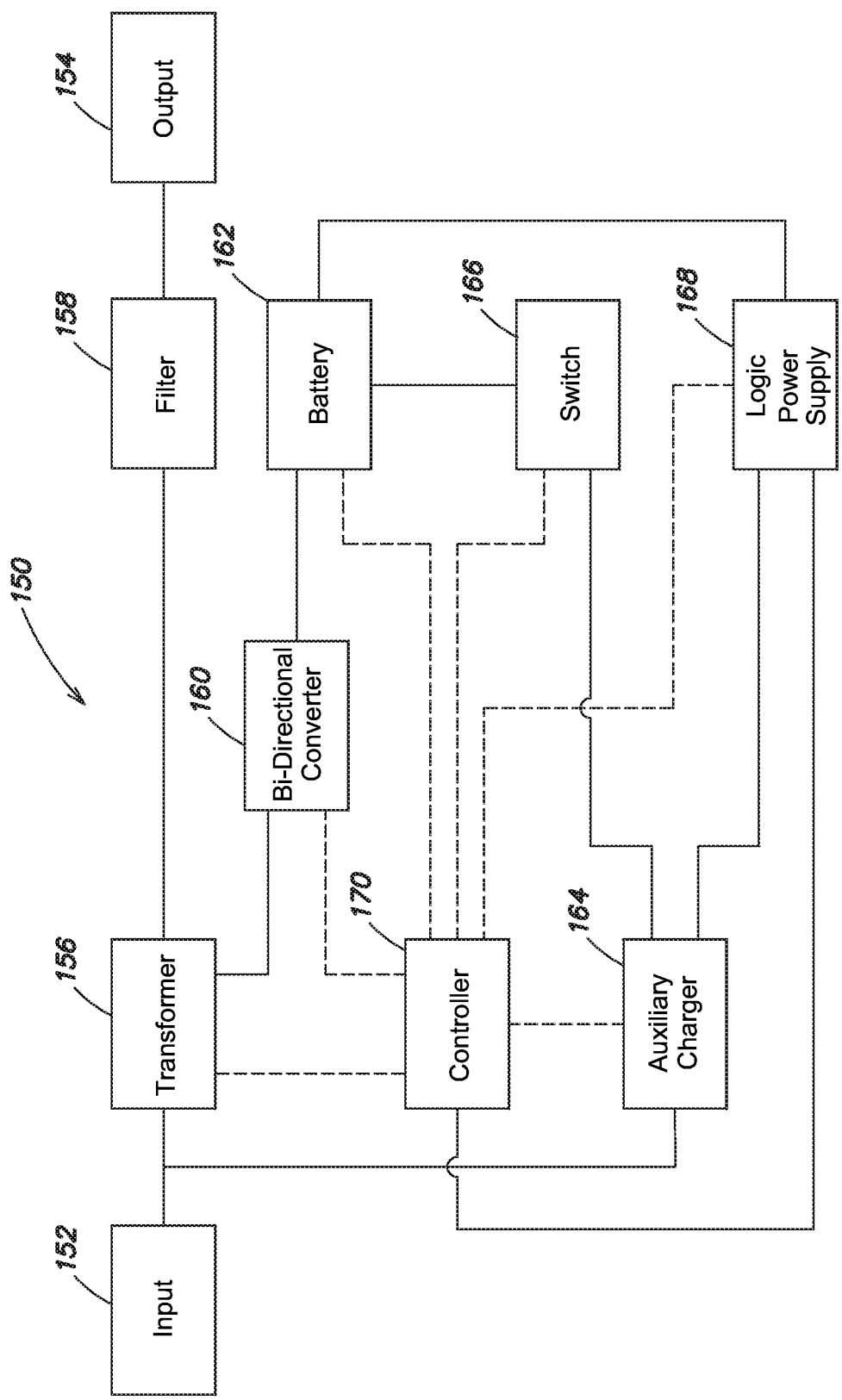
FIG. 1B is a block diagram of a line-interactive UPS.

FIG. 1B illustrates a block diagram of a line-interactive UPS 150 in accordance with one embodiment. The UPS 150 includes an input 152, an output 154, an auto-voltage-regulating transformer 156, a filter 158, a bi-directional converter 160, a battery 162, an auxiliary charger 164, a switch 166, an LPS 168, and a controller 170. In alternate embodiments, the battery 162 may be supplemented or replaced by at least one bank of one or more batteries.

The input 152 is connected to the transformer 156, the auxiliary charger 164, and an AC power supply (not shown). The transformer 156 is connected to the input 152, the filter 158, and the bi-directional converter 160, and is communicatively coupled to the controller 170. The filter 158 is coupled to the transformer 156 and the output 154. The output 154 is connected to the filter 158 and an external load (not shown). The bi-directional converter 160 is coupled to the transformer 156 and the battery 162, and is communicatively coupled to the controller 170. The battery 162 is coupled to the bi-directional converter 160, the switch 166, and the LPS 168, and is communicatively coupled to the controller 170.

The switch 166 is coupled to the auxiliary charger 164 and the battery 162, and is communicatively coupled to the controller 170. The LPS 168 is coupled to the battery 162, the auxiliary charger 164, and the controller 170, and is communicatively coupled to the controller 170. The auxiliary charger 164 is coupled to the input 152, the switch 166, and the LPS 168, and is communicatively coupled to the controller 170. The controller 170 is coupled to the LPS 168, and is communicatively coupled to the transformer 156, the bi-directional converter 160, the battery 162, the auxiliary charger 164, the switch 166, and the LPS 168.

Similar to the online UPS 100, the line-interactive UPS 150 is configured to operate in one of several different modes of operation based on the quality of the AC power received at the input 152. For example, according to one embodiment, the controller 170 monitors the AC power and, based on the characteristics of the monitored AC power, sends control signals to transformer 156, the bi-directional converter 160, the battery 162, the auxiliary charger 164, the switch 166, and the LPS 168 to control the operating mode of the UPS 150.

Using data stored in associated memory, the controller 170 is operable to execute one or more instructions that may result in manipulation of charger and battery current levels. In some examples, the controller 170 can include one or more processors or other types of controllers. The controller 170 may perform a portion of the functions discussed herein on a processor, and perform another portion using an Application-Specific Integrated Circuit (ASIC) tailored to perform particular operations. As illustrated by the examples described herein, examples in accordance with the present invention may perform the operations described herein using many specific combinations of hardware and software and the invention is not limited to any particular combination of hardware and software components.

If the AC power received at the input 152 is within a specified acceptable range, a portion of the AC power is provided to the output 154, and a portion of the AC power is provided to the battery 162 to charge the battery 162. If the AC power is not within a specified acceptable range, then the battery 162 is configured to provide stored power to the output 154.

During a normal operating mode, power received at the input 152 is provided to the transformer 156 and, depending on the state of the battery 162, to the auxiliary charger 164. The transformer 156 is configured to automatically regulate the received power and provide the regulated power to the filter 158. The filter 158 is configured to filter the regulated power and provide the filtered, regulated power to a load connected to the output 154.

In the normal operating mode, power is provided to the battery 162 to charge the battery 162 in one of at least two charging schemes. In a full charging mode, the transformer 156 is configured to provide a portion of the AC power received at the input 152 to the bi-directional converter 160, which is configured to rectify the AC power into DC power and provide the DC power to the battery 162 to charge the battery 162. In a trickle charging mode, the auxiliary charger 164 is configured to receive a portion of the AC power from the input 152, rectify the AC power into DC power, and provide the DC power to the LPS 168, and to the battery 162 via the switch 166 when the switch 166 is in a closed and conducting state.

The UPS 150 is configured to transition from a full charging mode to a trickle charging mode when the battery 162 reaches a threshold charge level, nominally referred to as a full charge level. The full charge level may be any specified or dynamically-determined charge level. When the full charge level is reached, the controller 170 is configured to disable the bi-directional converter 160 from charging the battery 162 and enable the auxiliary charger 164 to charge the battery 162. The auxiliary charger 164 can continue to provide a reduced current, referred to herein as a trickle charging current, to the battery 162 to maintain the full charge level. The trickle charging current is a relatively small current that, when measured directly, typically requires very sensitive measurement components for accurate quantification, resulting in expensive and overly-complex solutions to measure the trickle charging current.

To address the foregoing difficulties, at least some embodiments disclosed herein detect the trickle current indirectly. For example, in at least one embodiment, a current detector is provided in the auxiliary charger 164 to measure a total current provided by the auxiliary charger 164, part of which is provided to the battery 162 and part of which is provided to the LPS 168. The current provided to the LPS 168 is a substantially constant value that can be measured directly by selectively blocking current to the battery 162 and measuring the total current provided by the auxiliary charger 164. When current provision to the battery 162 is re-enabled, the value of the measured current provided to the LPS 168 can be subtracted from the measured total current provided by the auxiliary charger 164 to calculate the trickle current provided to the battery 162. Current provision to the battery 162 from the auxiliary charger 164 can be selectively enabled and disabled by controlling the conductive state of the switch 166.

Similar difficulties may exist with respect to the UPS 100, which can switch between a full charging mode and a trickle charging mode depending on the state of the battery 112. Direct measurement of the trickle charging current provided to the battery 112 similarly typically requires very sensitive measurement components for accurate quantification of the trickle charging current, resulting in expensive and overly-complex solutions in some examples. To address the foregoing difficulties, a current detector is provided in the charger 110 to measure a total current provided by the charger 110, part of which is provided to the battery 112 and part of which is provided to the LPS 114. The current provided to the LPS 114 is a substantially constant value that can be measured directly by selectively blocking current to the battery 112 and measuring the total current provided by the charger 110. When current provision to the battery 112 is restored, the value of the measured current provided to the LPS 114 can be subtracted from the measured total current provided by the charger 110 to calculate the trickle current provided to the battery 112. Current provision to the battery 112 from the charger 110 can be selectively enabled and disabled by controlling the conductive state of a switch coupled between the charger 110 and the battery 112.

Figure 2:
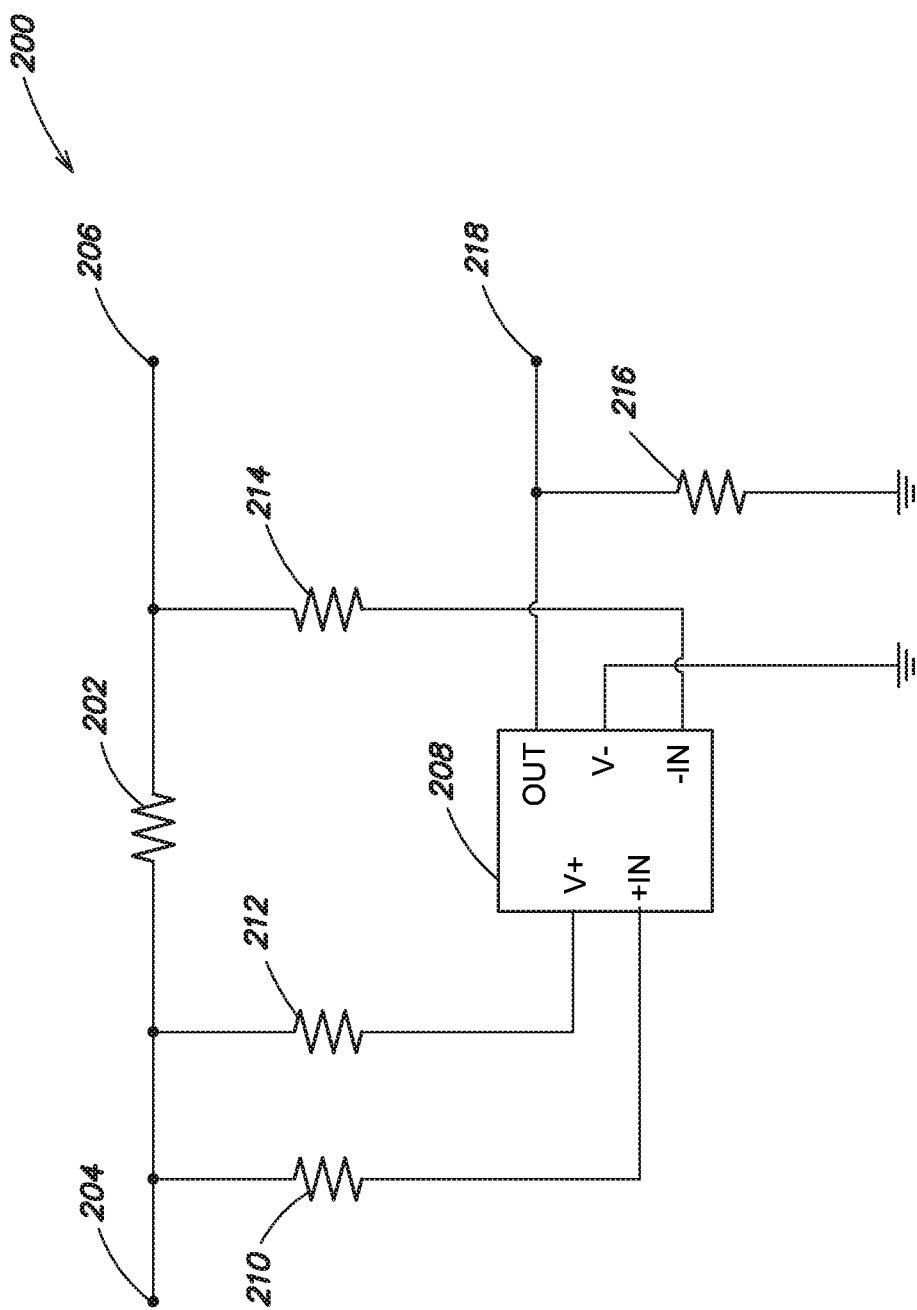
FIG. 2 is a circuit diagram of a conventional trickle current sensor.

FIG. 2 illustrates a conventional trickle current sensor 200 configured to be implemented in a battery (e.g., the battery 162). The trickle current sensor 200 includes a shunt resistor 202 connected between a first high side node 204 and a second high side node 206, and a high side current sense amplifier 208 connected to a first resistor 210, a second resistor 212, a third resistor 214, a fourth resistor 216, a current sense node 218, and a reference node (e.g., a ground node). The high side current sense amplifier 208 is configured to measure a voltage drop across the shunt resistor 202, calculate a current value therefrom, and provide a current sense signal indicative of the current value to the current sense node 218. The current sense node 218 may be connected to an external Digital Signal Processor (DSP) configured to receive the current sense signal. For example, and with reference to FIG. 1B, the DSP may use the sensed current value to modulate the amount of trickle current provided to the battery 162.

The trickle current sensor 200 suffers from at least three drawbacks. First, because measuring the trickle current directly requires a sensitive yet robust component, the high side current sense amplifier 208 is highly specialized and costly. The high side current sense amplifier 208 must be sensitive because the battery trickle current may be a very small value (e.g., 5-15 milliAmps [mA]). With continued reference to FIGS. 1B and 2, the current sense amplifier 208 must be robust because the trickle current sensor 200 is designed to be implemented in the battery 162 (i.e., the high side), which exhibits high voltages (e.g., 55 Volts [V]) capable of damaging sensitive components. To attenuate the effects of the high battery voltage on the current sense amplifier 208, the second resistor 212 is provided to mitigate the potentially-damaging effects of the high voltage on the current sense amplifier 208. Second, the trickle current sensor 200 requires the addition of another extra component—the shunt resistor 202—to provide a reference resistance from which to measure the trickle current. Increasing the component count unnecessarily increases design costs and complexity. Third, the addition of the shunt resistor 202 to provide a reference resistance leads to additional power losses and voltage drop caused by the extraneous shunt resistor 202, adversely affecting the efficiency of the trickle current sensor 200. Each of the foregoing deficiencies can be attributed, at least partially, to the fact that the trickle current sensor 200 and similar conventional sensors are implemented in the battery 162 to directly measure the relatively small trickle current provided to the battery 162.

Figure 3:
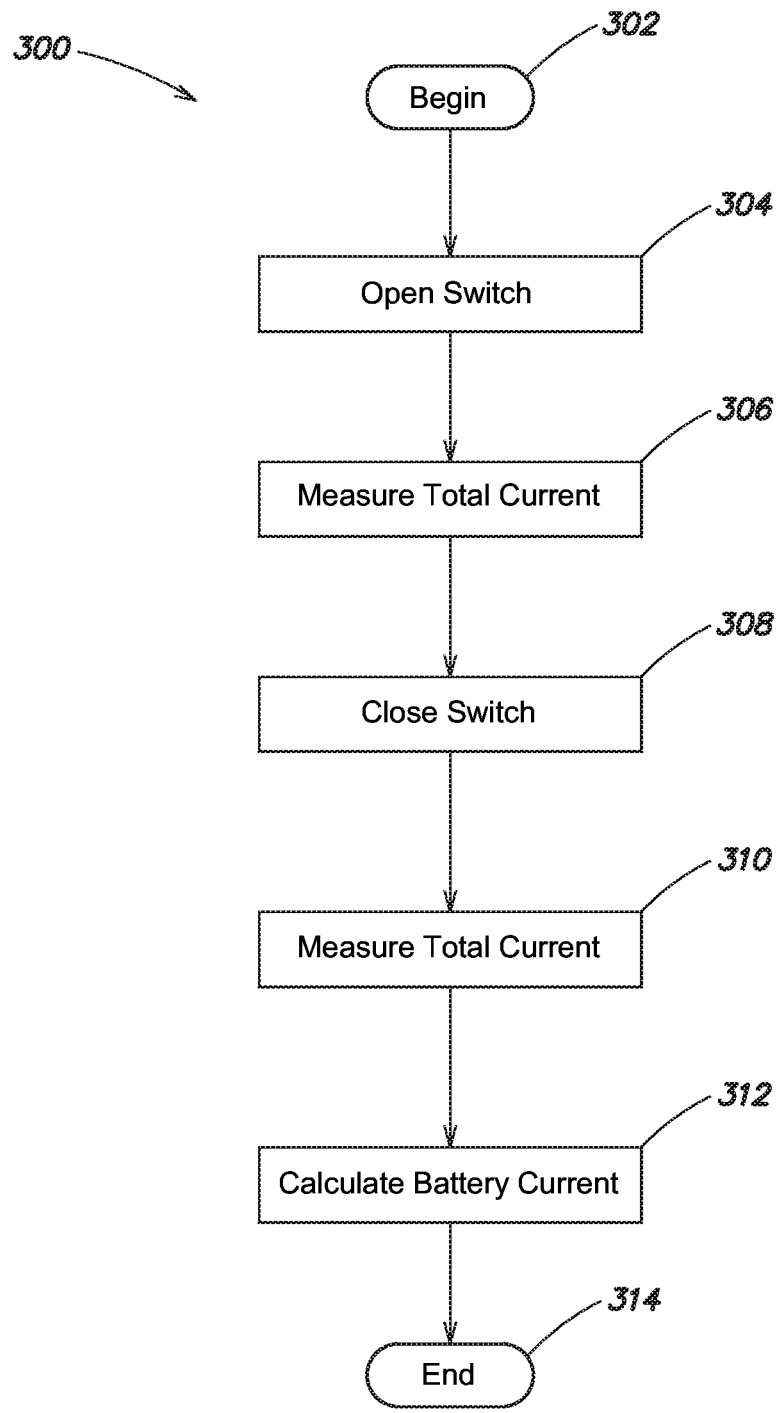
FIG. 3 is a flow diagram of a process for detecting a battery trickle current according to one embodiment.

FIG. 3 illustrates a process 300 for measuring a battery trickle current according to an embodiment of the present invention. The process 300 can be executed by a controller (e.g., the controller 116, the controller 170, etc.) and includes acts of opening a switch (e.g., the switch 166), measuring a first total current, closing the switch, measuring a second total current, and calculating a battery trickle current.

At act 302, the process 300 begins. At act 304, and with reference to FIG. 1B, the controller 170 opens the switch configured to selectively control provision of current to the battery 162 from the auxiliary charger 164, which provides power to the battery 162 and the LPS 168. For example, at act 304, opening the switch opens the charging path between the battery 162 and the auxiliary charger 164 to prevent the charging current from passing to the battery 162. The total current provided by the auxiliary charger 164 is therefore provided entirely and exclusively to the LPS 168. At act 306, the controller 170 measures the total current provided by the auxiliary charger 164 to the LPS 168 and stores a value representative of the current provided to the LPS 168. In at least one embodiment, the LPS 168 draws a substantially constant amount of current independent of the state of the switch.

At act 308, the controller 170 closes the switch, thereby re-enabling trickle current provision from the auxiliary charger 164 to the battery 162. At act 310, the controller 170 measures the total current provided by the auxiliary charger 164, part of which is provided to the battery 162, and part of which is provided to the LPS 168. At act 312, the controller 170 calculates the trickle current provided to the battery 162. For example, the controller 170 can use the LPS 168 current value measured at act 306 and the total current provided by the auxiliary charger 164 measured at act 310 to calculate the battery trickle current. The total current provided by the auxiliary charger 164 is equivalent to the sum of the trickle current of the battery 162 and the current provided to the LPS 168, and the trickle current is calculated by subtracting the value of the LPS 168 current from the total auxiliary charger 164 current. At act 314, the process 300 ends.

Figure 4:
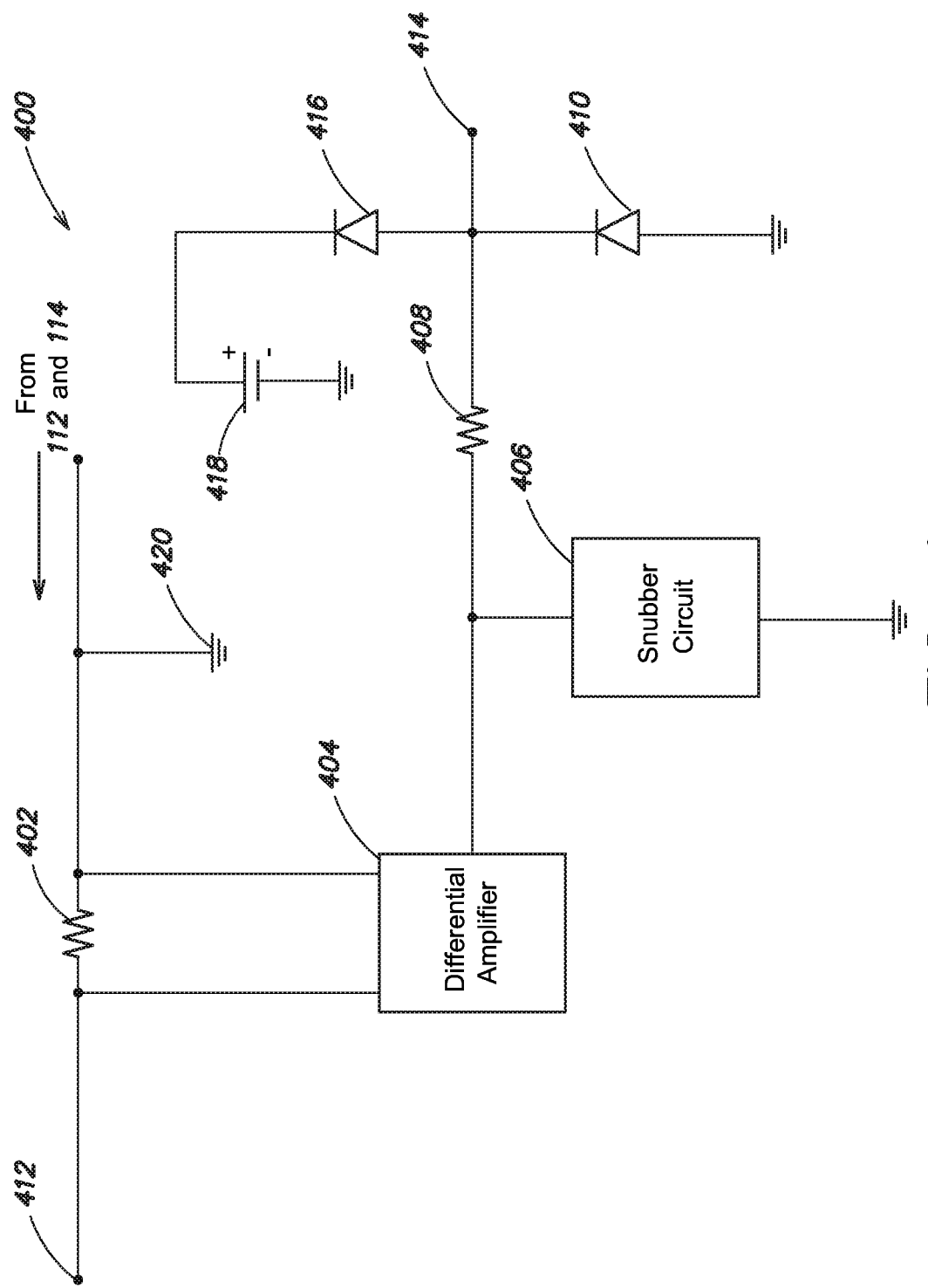
FIG. 4 is a simplified circuit diagram of a charger current sensing circuit according to one embodiment.

FIG. 4 illustrates a charger current sensor 400 configured to detect the total current provided by the auxiliary charger 164, as discussed above with respect to FIG. 3. The current sensor 400 includes a current-limiting resistor 402, a differential amplifier 404, a snubber circuit 406, a bias resistor 408, a first clamping diode 410, a second clamping diode 416, and a bias generator 418. In the embodiment shown, the current sensor 400 is implemented in the auxiliary charger 164, and is configured to measure a total current provided by the auxiliary charger 164. In other embodiments, the current sensor could be implemented outside of the auxiliary charger 164.

The differential amplifier 404 measures a voltage value across the current-limiting resistor 402, the resistance of which is a known value. The current-limiting resistor 402 is connected between a first node 412 and a second node 420 (e.g., a negative connection of the battery 162), which is coupled to the battery 162 and the LPS 168 in FIG. 5, as discussed in greater detail below. Using the measured voltage value and the known resistance value of the current-limiting resistor 402, the differential amplifier 404 generates a current sense signal indicative of a current value through the current-limiting resistor 402 and provides the current sense signal to an output node 414 through the bias resistor 408. The output node 414 may be coupled, for example, to a DSP configured to receive the analog current sense signal indicative of a total current through the current-limiting resistor 402. The DSP, which may be internal or external to the controller 170, is configured to process the analog current sense signal and to provide an output signal to modulate the total current provided by the auxiliary charger 164.

The current-limiting resistor 402 performs at least two functions. First, the current-limiting resistor 402 is, in at least one embodiment, a pre-existing component in the auxiliary charger 164 configured to limit a total current provided to the battery 162 and the LPS 168. Second, the current-limiting resistor 402 can be used as a reference resistor from which to calculate a total current value, as discussed above. Because the current-limiting resistor 402 is a pre-existing component, the charger current sensor 400 does not require an additional resistor to measure the total current output by the auxiliary charger 164, unlike the trickle current sensor 200 which requires the addition of the shunt resistor 202. Furthermore, there are no additional power losses in the current-limiting resistor 402 because the current-limiting resistor 402 is a pre-existing component, the power consumption of which is not appreciably affected by the addition of the charger current sensing circuitry.

With continued reference to the trickle current sensor 200, because the trickle current sensor 200 measures the trickle current directly, the trickle current sensor 200 requires a specialized high side current amplifier 208 to detect the relatively small current. Additionally, because the trickle current sensor 200 is subjected to the high voltages of the battery 162 in which it is implemented, the high side current amplifier 208 must be sufficiently robust as to not be damaged by the high voltage and requires the addition of the second resistor 212 to attenuate the high voltage. Conversely, the charger current sensor 400 is exposed to lower voltages in the auxiliary charger 164 than in the battery 162 and therefore need not be as robust as the high side current amplifier 208 nor require a resistor to attenuate the high voltage. Furthermore, the charger current sensor 400 is configured to measure a total current provided by the auxiliary charger 164, which is not as small as the battery trickle current and therefore does not require a highly sensitive and specialized current-measurement component. The differential amplifier 404 is capable of measuring the total current provided by the auxiliary charger 164, and is less expensive and more prolific than the high side current amplifier 208. Obviation of a need for a specialized and expensive component provides several advantages, as discussed above.

The snubber circuit 406 is configured to suppress a voltage transient between the differential amplifier 404 and the snubber circuit 406. For example, the snubber circuit 406 may include a resistor connected in series with a capacitor such that a sudden voltage spike is resistively dissipated through the resistor and the capacitor. The bias resistor 408 is a resistor configured to bias the current sense signal output by the differential amplifier 404, and can be tuned to the requirements of the DSP connected to the output node 414.

The first clamping diode 410 is configured to prevent a negative voltage spike from appearing at the output node 414. For example, if a negative voltage spike sufficient to forward-bias the first clamping diode 410 is present at the output node 414, the output node 414 will be tied to the ground node through the forward-biased first clamping diode 410, thereby avoiding a negative voltage spike in excess of the forward voltage of the first clamping diode 410 from damaging components connected to the output node 414.

Similarly, the second clamping diode 416 is configured to prevent a positive voltage spike from appearing at the output node 414. The anode of the second clamping diode 416 is connected to the output node 414, and the cathode of the second clamping diode 416 is connected to the bias generator 418, which is configured to provide a bias voltage (e.g., a bias voltage of 3.3 V). For example, if a positive voltage spike sufficient to forward-bias the second clamping diode 416 is present at the output (e.g., a voltage spike having a voltage level greater than the bias voltage), the output node 414 will be tied to the voltage output by the bias generator 418 through the forward-biased second clamping diode 416, thereby avoiding a positive voltage spike in excess of the bias voltage from damaging components connected to the output node 414.

Figure 5:
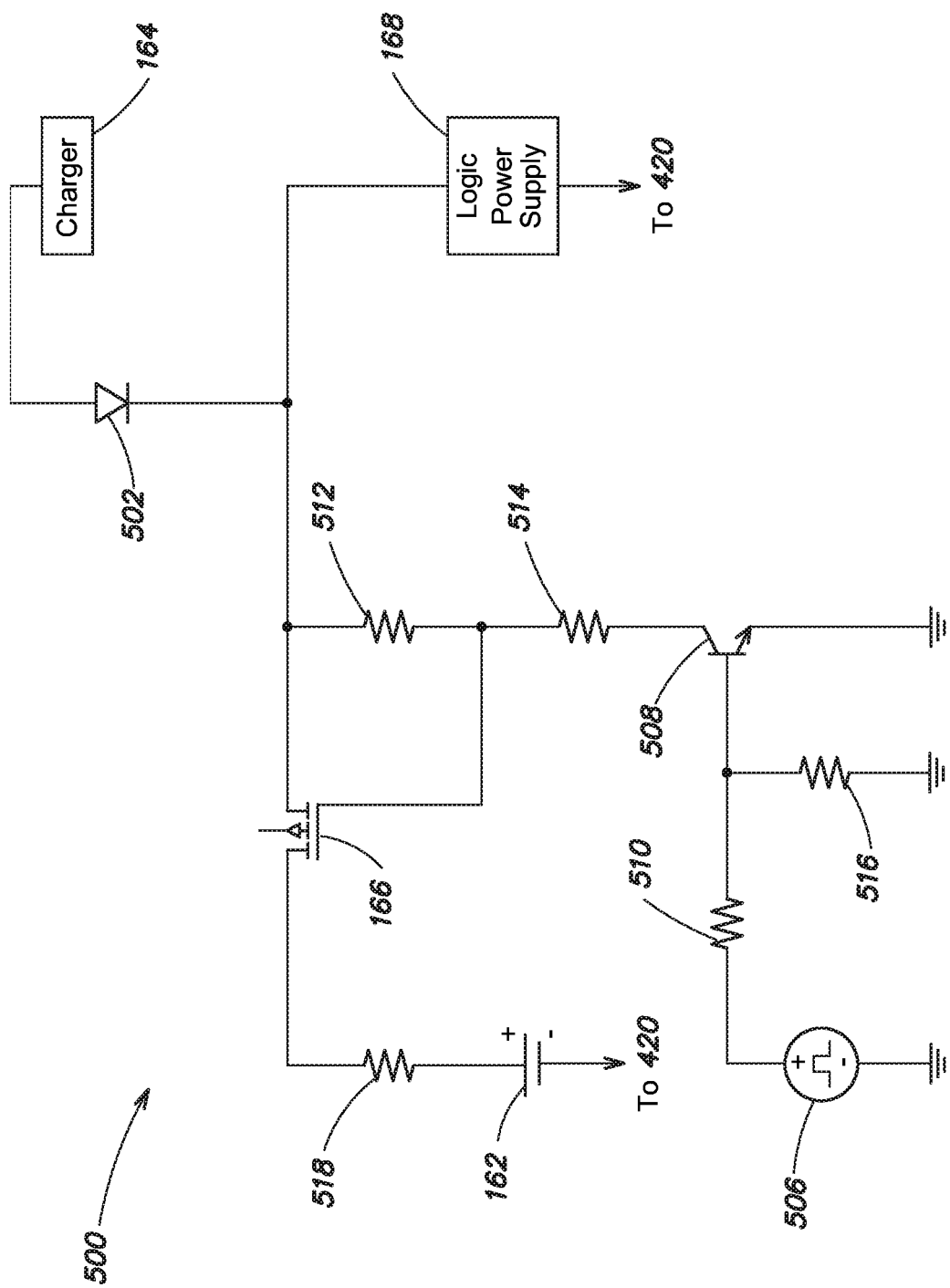
FIG. 5 is a simplified circuit diagram of a current distribution topology according to one embodiment.

FIG. 5 is a simplified circuit 500 that illustrates current distribution in the UPS 150. The simplified circuit 500 includes the battery 162, the auxiliary charger 164, the switch 166, the LPS 168, a diode 502, a rest signal generator 506, an activation switch 508, a first resistance 510, a second resistance 512, a third resistance 514, a fourth resistance 516, and a battery resistance 518. As discussed above, the auxiliary charger 164 is configured to provide a total current, part of which is supplied to the battery 162 and part of which is supplied to the LPS 168, through the diode 502. The diode 502 is operable to prevent an undesirable reverse current from passing into the auxiliary charger 164.

When the switch 166 is in a closed and conducting position, part of the total current supplied by the auxiliary charger 164 passes through the switch 166 to charge the battery 162 and the remainder of the total current is provided to the LPS 168. The current provided to the battery 162 and the LPS 168 subsequently passes to the second node 420 of FIG. 4 and passes through the current-limiting resistor 402 to generate the current sense signal. A small portion of the total current supplied by the auxiliary charger 164 may also be drawn through the second resistor 512, as discussed in greater detail below, but is substantially negligible. Conversely, when the switch 166 is in an open and non-conducting position, all of the current supplied by the auxiliary charger 164 is supplied to the LPS 168.

As discussed above, the amount of current drawn by the LPS 168 is substantially constant regardless of the state of the switch 166. The current required by the LPS 168 can therefore be calculated by measuring the total current provided by the auxiliary charger 164 when the switch 166 is in an open and non-conducting position, such that current is prevented from passing to the battery 162, and the total current is approximately equivalent to the current required by the LPS 168. When the switch 166 is closed subsequent to measuring the current provided to the LPS 168, and the battery 162 begins to draw a current, the current can be calculated by measuring the total current supplied by the auxiliary charger 164 and subtracting out the known current value provided to the LPS 168.

In at least one embodiment, the switch 166 can be implemented as a P-type Metal-Oxide-Semiconductor Field Effect Transistor (MOSFET). As will be appreciated by one of ordinary skill in the art, a P-type MOSFET is configured to close when an appropriate bias voltage (e.g., a sufficiently negative voltage relative to the drain-source voltage) is applied to the gate connection thereof. Because the gate connection of the switch 166 is tied to the node connecting the second resistor 512 and the third resistor 514, the gate bias voltage is substantially dependent on the current passing through the second resistor 512 and the third resistor 514. To modulate the current passing through the second resistor 512 and the third resistor 514, the state of the series-connected activation switch 508 is controlled to adjust an amount of current passing to ground through the second resistor 512, the third resistor 514, and the activation switch 508.

In at least one embodiment, the activation switch 508 is implemented as an npn Bipolar Junction Transistor (BJT). The collector current drawn by the activation switch 508, which is the current drawn through the second resistor 512 and the third resistor 514, is modulated by adjusting the voltage applied to the base of the activation switch 508, which is in turn controlled by the rest signal generator 506. The rest signal generator 506 is operable to generate a voltage signal in accordance with control signals (e.g., provided by the controller 170) indicative of a desired state of the switch 166. Accordingly, the state of the switch 166 (i.e., conducting or non-conducting) is controlled by the state (i.e., logic HIGH or logic LOW) of the rest signal generator 506.

In alternate embodiments, the rest signal generator 506 may be connected directly to the gate of the switch 166, and the second resistor 512, the third resistor 514, and the activation switch 508 may be removed. The first resistor 510 and the fourth resistor 516 may or may not be included to bias the gate control signal provided by the rest signal generator 506.

The battery resistance 518 connected between the battery 162 and the switch 166 is representative of an internal resistance of the battery 162, which is, in turn, representative of an ideal DC battery. Accordingly, although the battery 162 and the battery resistance 518 are illustrated as disparate elements, the battery 162 and the battery resistance 518 are collectively representative of intrinsic elements of a single non-ideal DC battery.

Figure 6:
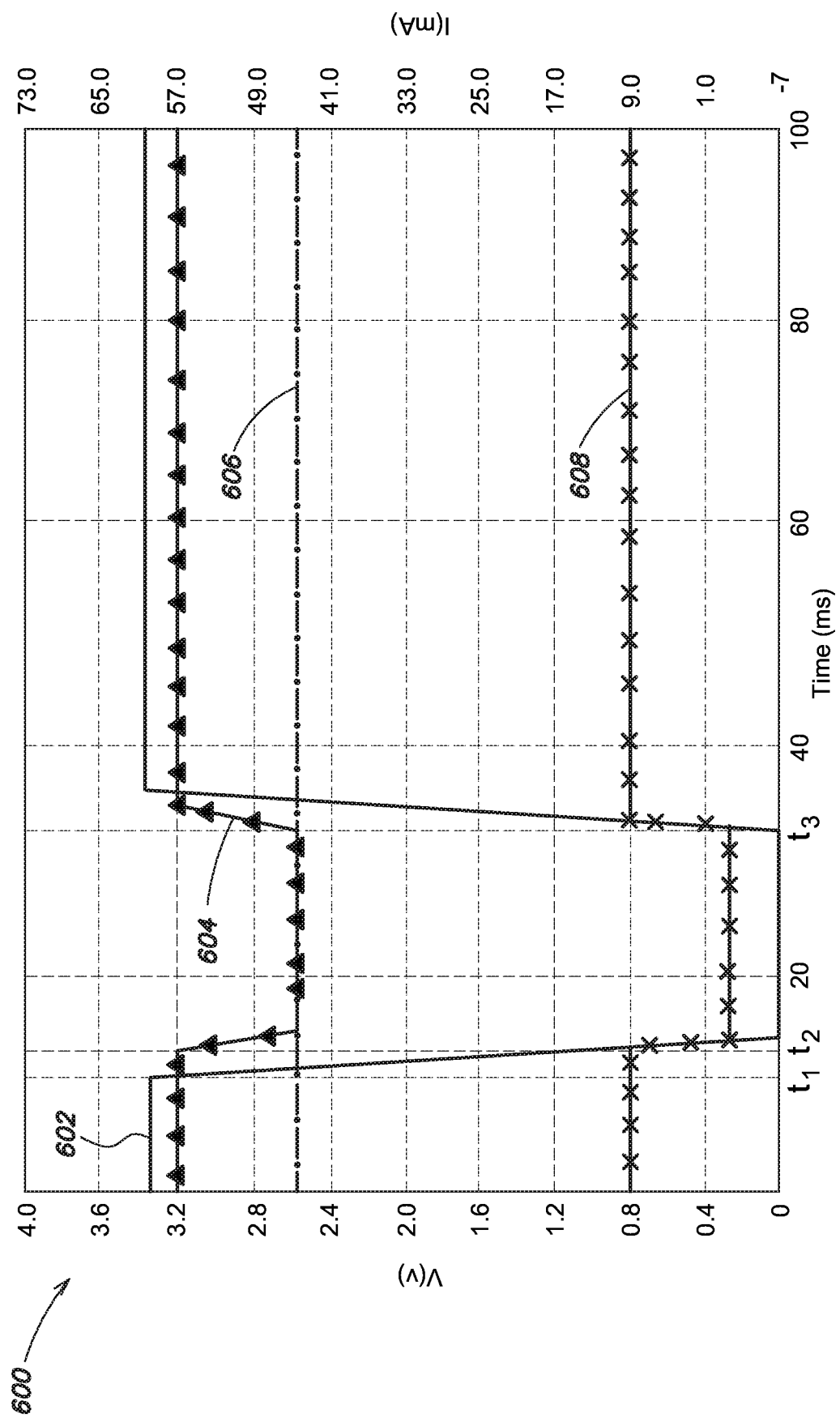
FIG. 6 is a graph of current and voltage traces with respect to time according to one embodiment.

FIG. 6 illustrates signal traces 600 indicative of voltage and current signals in the simplified circuit 500. The signal traces 600 include a rest signal generator voltage trace 602, a diode current trace 604, an LPS current trace 606, and a battery current trace 608. The rest signal generator voltage trace 602 indicates a voltage signal output by the rest signal generator 506. The diode current trace 604 indicates a total current value passing through the diode 502, which is equivalent to the total current provided by the auxiliary charger 164. The LPS current trace 606 indicates a current value drawn by the LPS 168. The battery current trace 608 indicates a current value drawn by the battery 162.

Leading up to a time $t_1$, each of the traces 602-608 is substantially constant. The rest signal voltage generator trace 602 is at a logic HIGH value (e.g., having a voltage of approximately 3.3 V). As indicated by the battery current trace 608, the battery 162 draws a small trickle current (e.g., approximately 5-15 mA) while the rest signal voltage generator trace 602 is at a logic HIGH value. The diode current trace 604, as discussed above, is roughly equivalent to the sum of the LPS current trace 606 and the battery current trace 608.

At the time $t_1$, the rest signal generator voltage trace 602 begins to transition to a logic LOW state (e.g., 0 V). After a short time delay, during which the bias voltage provided to the gate of the switch 166 drops off, the switch 166 begins to transition from a closed and conducting state to an open and non-conducting state. As indicated by the battery current trace 608, the current drawn by the battery 162 drops off to approximately zero at time $t_2$ as the switch 166 stops conducting current entirely. The diode current trace 604, in turn, drops by an equal amount and becomes substantially equivalent to the LPS current trace 606. As discussed above, the LPS current trace 606 remains substantially constant, independent of the state of the rest signal generator voltage trace 602. Between the times $t_2$ and $t_3$, the total current value indicated by the diode current trace 604 is measured and the value thereof is stored as a value indicative of the current drawn by the LPS 168.

At the time $t_3$, the rest signal generator voltage trace 602 begins to transition back to a logic HIGH state, and the battery 162 resumes drawing a trickle current as indicated by the battery current trace 608. Each of the traces 602-608 returns to a substantially constant value, and the value of the battery current trace 608 can be calculated by measuring the value of the diode current trace 604 and subtracting the known value of the LPS current trace 606.

Battery trickle current measurement circuitry and a method of operating the same have been disclosed. The disclosed implementations provide increased efficiency, reduced cost, and a reduced component count relative to existing solutions, the benefits of which have been discussed herein. Although specific implementations of the discussed solutions have been illustrated, alternate implementations are intended to be within the scope of the present disclosure.

For example, although the various switching elements (e.g., the switch 166, the activation switch 508, etc.) have been depicted as specific types of switches, alternate implementations are possible. Each of the switching elements may be implemented as an N-type MOSFET, a P-type MOSFET, an npn BJT, a pnp BJT, an electronic relay, and so forth. Furthermore, specific values have been provided for educational purposes and are not intended to be limiting.

Furthermore, although the auxiliary charger 164 has been described as providing current to the LPS 168 and the battery 162, alternate implementations are possible. For example, the auxiliary charger 164 may provide current to alternate circuitry in addition to, or in lieu of, the LPS 168, and the determination of the current provided to the battery 162 may be adjusted to account for the alternate circuitry.

The aforementioned benefits may be achieved through more than one embodiment, and alternate design factors may occasion modification of the type, number, or configuration of components. Although certain embodiments discussed above discuss the implementation of trickle current detectors in UPSs, the trickle current detectors discussed herein may be implemented in any suitable power device. Although the trickle current of interest has been described herein as a small value, the trickle current detectors discussed herein may detect a range of current values, and are not bound to specific current value or values.

While the chargers discussed herein have been described as being connected to an external power supply, such as an AC mains power supply, it is to be appreciated that the charger may be coupled to any external or internal AC or DC power supply, or may not be coupled to any additional AC or DC power supply. Further, embodiments of devices described herein as operating from AC power or providing AC power may operate at a number of different AC line frequencies including 50 Hz and 60 Hz.

Although the foregoing description involves line-interactive UPSs, alternate embodiments may involve the use of online UPSs, offline UPSs, and so forth. Furthermore, although the foregoing description involves sensing a trickle current, alternate embodiments may be configured to sense a trickle current, a full charging current, or both. Further, battery chargers and trickle current measurement devices and methods disclosed herein may be used in devices other than UPSs including other battery powered devices such as laptop computers.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of detecting a battery current in an uninterruptible power supply, the method comprising acts of:
   using a charger, providing a battery current to a battery along a charging path;
   opening the charging path to stop the battery current to the battery;
   determining a first total current supplied by the charger, the first total current being supplied while the charging path is opened;
   enabling the battery current to be provided to the battery;
   determining a second total current supplied by the charger, the second total current being supplied by the charger while the battery current is being supplied to the battery; and
   determining, based on the first total current and the second total current, a value representative of the battery current.

2. The method of claim 1, further including acts of storing a first current value indicative of the first total current supplied by the charger.

3. The method of claim 2, wherein determining the value representative of the battery current includes subtracting the first current value from the second total current.

4. The method of claim 1, wherein opening the charging path includes opening a switch disposed in the charging path.

5. The method of claim 4, wherein enabling the battery current to be provided to the battery includes closing the switch.

6. An uninterruptible power supply system, the system including:
- an input configured to receive input power having an input voltage;
- a battery configured to store battery power;
- an output configured to provide output power derived from at least one of the input power and the battery power;
- a charging circuit, connected to the battery and power circuitry, the charging circuit configured to provide a total current, the total current including at least one of a first portion which is provided to the battery and a second portion which is provided to the power circuitry;
- a charger current sensor configured to detect the total current and provide at least one sense signal indicative of the total current;
- a switch connected to the battery and being configured to selectively control provision of current to the battery; and
- a controller, coupled to the switch and to the charger current sensor, the controller being configured to:
  - open the switch to prevent the battery from receiving the first portion of the total current;
  - receive, from the charger current sensor, a first sense signal indicative of the total current;
  - close the switch to enable the battery to receive the first portion of the total current;
  - receive, from the charger current sensor, a second sense signal indicative of the total current; and
  - determine, based on the first sense signal and the second sense signal, a value representative of the first portion of the total current.

7. The system of claim 6, wherein the charging circuit includes the charger current sensor.

8. The system of claim 6, wherein the charger current sensor includes a differential amplifier and a resistor.

9. The system of claim 8, wherein the differential amplifier is configured to detect a current through the resistor.

10. The system of claim 9, wherein the current through the resistor is the total current.

11. The system of claim 6, wherein the controller is further configured to store a first current value representative of the first sense signal.

12. The system of claim 11, wherein the first current value is equivalent to the second portion of the total current.

13. The system of claim 6, wherein the second portion of the total current is substantially independent of the first portion of the total current.

14. The system of claim 6, further including an activation switch.

15. The system of claim 14, wherein the activation switch is a Bipolar Junction Transistor (BJT) having a base connection, a collector connection, and an emitter connection.

16. The system of claim 15, wherein the switch is a Metal-Oxide-Semiconductor Field-Effect Transistor (MOSFET) having a gate connection, a source connection, and a drain connection.

17. The system of claim 16, wherein a gate voltage at the gate connection of the switch is controlled substantially by a collector current drawn by the collector connection of the activation switch.

18. The system of claim 17, wherein the collector current is controlled substantially by a base current provided to the base connection of the activation switch.

19. The system of claim 18, wherein the base current is controlled substantially by the controller.

20. An uninterruptible power supply system, the system comprising:
- a charger, connected to a battery and a logic power supply, the charger configured to provide a total current including at least one of a first portion which is provided to the battery and a second portion which is provided to the logic power supply, the charger including a charger current sensor configured to detect the total current and provide at least one sense signal indicative of the total current; and
- means for controlling the charger current sensor to detect the first portion of the total current and the second portion of the total current.

* * * * *

UNITED STATES PATENT AND TRADEMARK OFFICE
CERTIFICATE OF CORRECTION

PATENT NO. : 10,641,831 B2
APPLICATION NO. : 15/686187
DATED : May 5, 2020
INVENTOR(S) : Fu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 282 days.

Signed and Sealed this
Tenth Day of January, 2023

Katherine Kelly Vidal
*Director of the United States Patent and Trademark Office*